(12) United States Patent
Grijaldo et al.

(10) Patent No.: US 9,881,891 B1
(45) Date of Patent: Jan. 30, 2018

(54) METHOD OF FORMING THREE-DIMENSIONAL WIRE LOOPS AND WIRE LOOPS FORMED USING THE METHOD

(71) Applicant: ASM Technology Singapore Pte Ltd, Singapore (SG)

(72) Inventors: Jeffrey Grijaldo, Singapore (SG); Jung Min Kim, Incheon (KR); Joon Ho Lee, Seoul (KR); Chi Kwan Park, Singapore (SG); Keng Yew Song, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/351,652

(22) Filed: Nov. 15, 2016

(51) Int. Cl.
  *H01L 21/44* (2006.01)
  *H01L 23/48* (2006.01)
  *H01L 23/00* (2006.01)

(52) U.S. Cl.
  CPC .............. *H01L 24/48* (2013.01); *H01L 24/85* (2013.01); *H01L 2224/48456* (2013.01); *H01L 2224/48465* (2013.01); *H01L 2224/85947* (2013.01); *H01L 2924/3512* (2013.01)

(58) Field of Classification Search
  CPC ......... H01L 24/43; H01L 24/45; H01L 24/48; H01L 24/78; H01L 2224/43; H01L 2224/432; H01L 2224/4321; H01L 2224/43985; H01L 2224/48227; H01L 2224/48247; H01L 2224/92247
  USPC ...... 228/4.5, 180.5, 258; 257/734, 777, 780, 257/784; 438/106–109, 111
  See application file for complete search history.

(56) References Cited

U.S. PATENT DOCUMENTS 6,315,190 B1 * 11/2001 Nishiura .............. B23K 20/004
    228/179.1
6,343,733 B1 * 2/2002 Nishiura ................. H01L 24/48
    228/180.5
8,946,913 B2 * 2/2015 Har ........................ H01L 24/48
    257/784

* cited by examiner

*Primary Examiner* — Hsien Ming Lee
(74) *Attorney, Agent, or Firm* — Ostrolenk Faber LLP

(57) ABSTRACT

The invention provides a method of bonding wire between first and second bonding points with a bonding tool. It comprises the steps of forming a first bond at the first bonding point with the bonding tool, forming a first kink located over the first bond, and moving the bonding tool to a first position spaced from the first kink by a predetermined distance to release a length of wire from the bonding tool. It further comprises the step of moving the bonding tool in a direction away from the second bonding point to a second position which is outside a plane comprising the first bonding point, the second bonding point, and the first kink. It also comprises the steps of forming a second kink which lies outside the plane, and moving the bonding tool to the second bonding point to form a second bond.

15 Claims, 5 Drawing Sheets

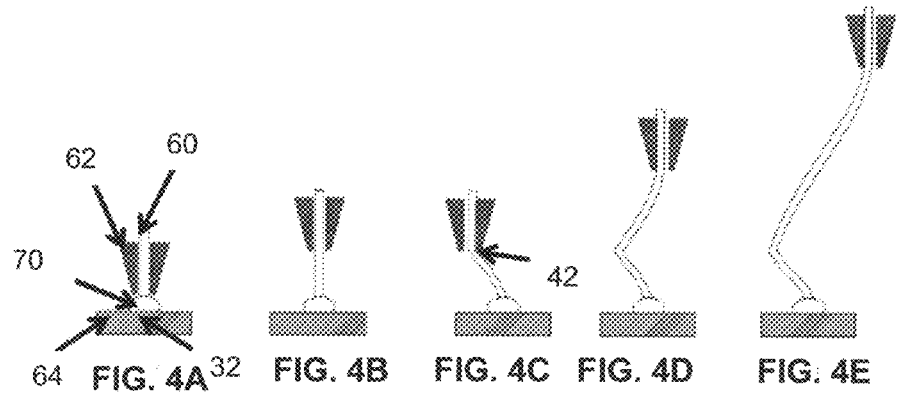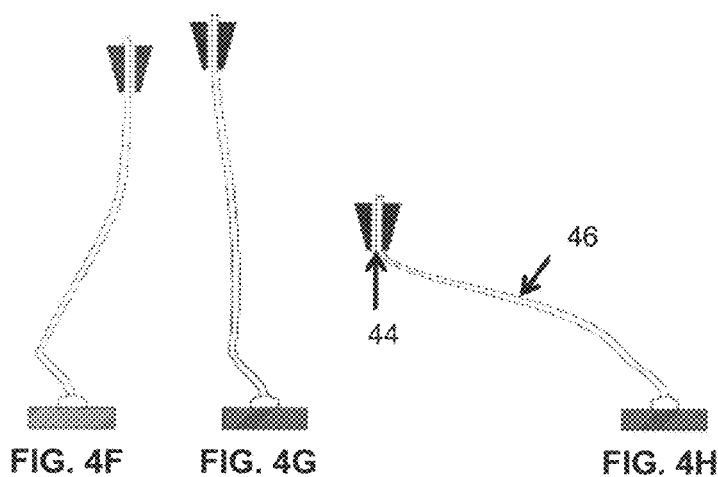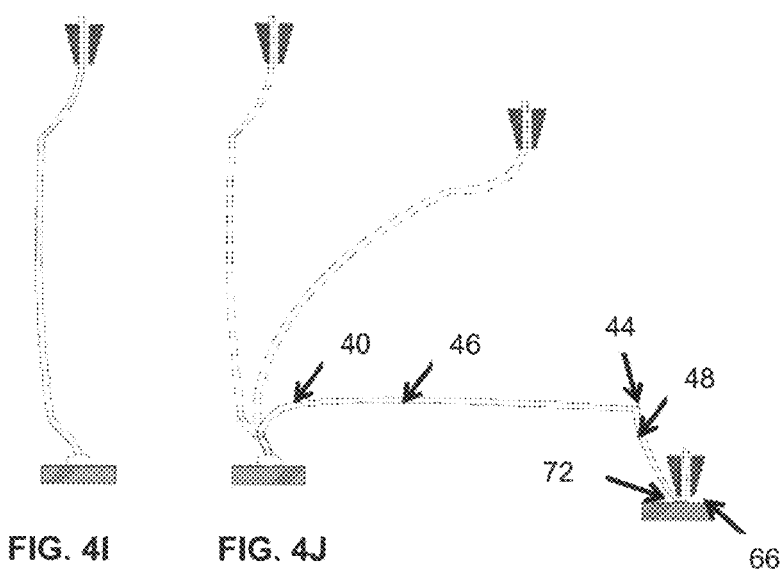

METHOD OF FORMING THREE-DIMENSIONAL WIRE LOOPS AND WIRE LOOPS FORMED USING THE METHOD

FIELD OF THE INVENTION

The invention relates to a method of forming wire loops between different bonding points on semiconductor devices, such as the formation of wire loops in over-die and in-board wire bonding applications. The invention also relates to wire loops formable using the method.

BACKGROUND AND PRIOR ART

During certain semiconductor assembly processes, semiconductor dice are placed on a carrier such as a lead frame substrate. Electrical connections in the form of wire bonds are then made between the semiconductor dice and lead frame substrate, between individual dice, or between different points on the lead frame substrate. Gold, aluminum, silver, or copper wires are commonly used to make these wire bonds.

Wire bonds are formed at bonding sites where the electrical connections are to be made. Typically an ultrasonic transducer is used to generate ultrasonic energy to attach a free air ball (FAB) from a capillary to a semiconductor die or a carrier. This forms a ball bond at a first bonding site. Thereafter, the capillary is moved to a second bonding site as the bonding wire is fed out from the capillary, forming a wire loop. A stitch bond is then formed at the second bonding site, which is usually on the carrier and adjacent a perimeter of the semiconductor die. This completes the formation of a wire bond to electrically connect the first bonding site to the second bonding site. After all the necessary wire bonds are made, the dice, wire loops, and carrier are encapsulated with a resin material to protect them, whereby a semiconductor package is produced.

There is a continuing desire in the semiconductor industry to develop smaller semiconductor packages. Since the wire loops should be fully encapsulated in the final semiconductor package and the wire loops bonding sites are usually located adjacent the peripheries of the semiconductor dice, the surface area occupied by the package would be affected by the locations of the wire loops bonding sites. This means that the nearer the wire loops bonding sites are to the perimeters of the dice, the smaller the final semiconductor package can be.

Although it is desirable to position the wire loop bonding sites nearer to the perimeters of the dice, the ability to do so during the design of the semiconductor package is limited by various factors. One limiting factor would be the capillary size. The size of the capillary which holds and dispenses the bonding wire during wire bonding would physically limit how close the wire loop bonding sites can be to the perimeters of the dice. Another limiting factor is the weakness in the neck of the bonding wire at the point where the bonding wire is bent towards the second bonding site. The nearer the wire loops bonding sites are to the perimeters of the dice, the more the bonding wire forming the wire loop would have to be bent towards the second bonding site, causing an increased risk that the bonding wire will crack at the neck. If the bonding wire cracks, the resulting electrical connection would become unreliable or unstable.

FIGS. 1A and 1B are side and top views respectively of a conventional wire loop 10 employed in an over-die wire bonding application. The wire loop 10 and a semiconductor die 20 are formed on a substrate 30. The wire loop 10 is formed over the top surface of the semiconductor die 20.

The wire loop 10 is bonded at a first bonding point 32 on the substrate 30. The wire loop 10 extends therefrom substantially vertically and substantially parallel to a first side of the semiconductor die 20, and bends at a first kink 12 towards a second bonding point 34. A span portion 16 of the wire loop 10 extends from the first kink 12 substantially horizontally and parallel to the top surface of the semiconductor die 20, and bends at a second kink 14 towards the second bonding point 34. A slope portion 18 of the wire loop 10 begins from the second kink 12 at an opposing second side of the semiconductor die 20, and inclines towards the second bonding point 34 where it is bonded to the substrate 30. The wire loop 10 is substantially located on a vertical plane. In other words, the first bonding point 32, the first kink 12, the span portion 16, the second kink 14, and the second bonding point 34 are all located substantially on the same vertical plane.

A side view horizontal span length is defined as the horizontal distance substantially parallel to a width of the semiconductor die 20 between the first kink 12 and the second kink 14, as viewed from the side view shown in FIG. 1A. A side view horizontal slope length is defined as the horizontal distance between the second kink 14 and the second bonding point 34, as viewed from the side view shown in FIG. 1A. It is usually more meaningful to express the side view horizontal span length and the side view horizontal slope length as percentages of a side view total horizontal distance (comprising a sum of both lengths). A second kink vertical height is the vertical distance between the second kink 14 and the second bonding point 34, as viewed from the side view shown in FIG. 1A. A side view vertical landing angle is the angle at the second bonding point 34 formed between the surface of the substrate 30 or the second bonding point 34 and the slope portion 18, as viewed from the side view shown in FIG. 1A.

It is desirable for the first and second bonding points 32, 34 to be as close to the respective sides of the semiconductor die 20 as possible, in order for the packages to be smaller. Hence, it should be appreciated that the side view horizontal span length percentage should be as high as possible, preferably above 85% of the side view total horizontal distance, and that the side view vertical landing angle should be high as possible, preferably above 80 degrees. However, factors such as the shape and size of the capillary which holds and dispenses the bonding wire during wire bonding would physically limit the side view vertical landing angle of the wire loop 10 to below 80 degrees and limit the side view horizontal span length to be below 80% of the side view total horizontal distance.

In addition, the second kink vertical height should be sufficiently high in order to provide an adequate clearance from the semiconductor die 20 surface. This is to avoid the wire loop 10 contacting the semiconductor die 20, and causing a short circuit. It should be noted that by increasing the second kink vertical height, the side view vertical landing angle would also increase (assuming the side view horizontal span length and the side view horizontal slope length are kept constant).

SUMMARY OF THE INVENTION

It is an object of the present invention to seek to provide an improved method of forming wire loops which overcomes the limitations of the prior art.

According to a first aspect of the present invention, there is provided a method of bonding wire between first and second bonding points with a bonding tool, comprising the steps of: forming a first bond at the first bonding point with the bonding tool; forming a first kink located over the first bond; moving the bonding tool to a first position spaced from the first kink by a predetermined distance to release a length of wire from the bonding tool; moving the bonding tool in a direction away from the second bonding point to a second position which is outside a plane comprising the first bonding point, the second bonding point, and the first kink; forming a second kink which lies outside the plane; and moving the bonding tool to the second bonding point to form a second bond.

According to a second aspect of the present invention, there is provided a wire loop bonded between a first bonding point and a second bonding point, comprising: a first kink located above the first bonding point, wherein the first and second bonding points and the first kink lie on a first plane; a second kink located outside the first plane; and a span portion connecting the first kink and the second kink, wherein the first and second kinks and the first bonding point lie on a second plane which is disposed at an angle to the first plane.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Example of methods and wire loops formed in accordance with the invention will now be described with reference to the accompanying drawings, in which:

FIGS. 4A to 4J are diagrammatic illustrations showing the shapes of a bonding wire at different positions of a bonding tool during wire loop formation according to the preferred embodiment of the invention.

DETAILED DESCRIPTION OF THE PREFERRED EMBODIMENTS

Figure 2A:
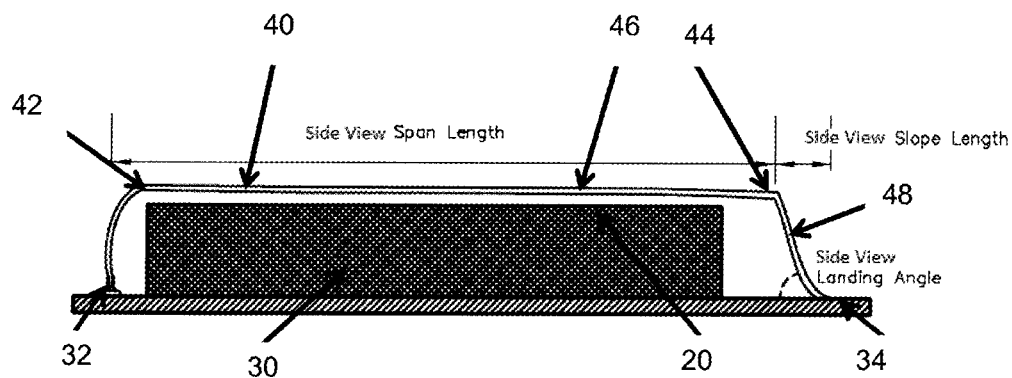
FIGS. 2A and 2B are side and top views respectively of the preferred embodiment of the invention employed in an over-die wire bonding application.
Figure 2B:
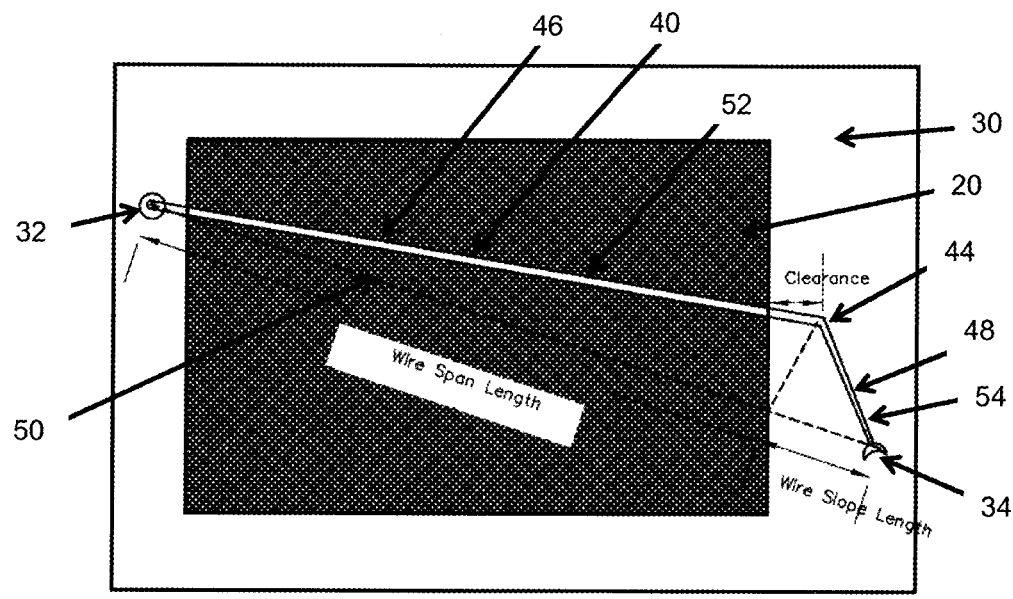

It should be noted that certain aspects of the figures have been exaggerated for illustration purposes. FIGS. 2A and 2B are side and top views respectively of the preferred embodiment of the invention employed in an over-die wire bonding application. A wire loop 40 and a semiconductor die 20 are formed on a substrate 30. The wire loop 40 is formed over the top surface of the semiconductor die 20 without contacting the semiconductor die 20. The wire loop 40 is bonded to the substrate 30 at a first bonding point 32 and a second bonding point 34.

The wire loop 40 is bonded at the first bonding point 32 on the substrate 30. The wire loop 40 extends therefrom substantially vertically and substantially parallel to a first side of the semiconductor die 20, and bends at a first kink 42. A span portion 46 of the wire loop 40 extends from the first kink 42 substantially horizontally and parallel to the top surface of the semiconductor die 20 towards an opposing second side of the semiconductor die 20, to a second kink 44. The wire loop 40 bends at the second kink 44 towards the second bonding point 34. A slope portion 48 of the wire loop 40 begins from the second kink 42 at the second side of the semiconductor die 20, and inclines towards the second bonding point 34 where it is bonded to the substrate 30.

Unlike conventional wire loops 10 as described above, the wire loop 40 according to the preferred embodiment of the invention is not substantially located on a single vertical plane. The first bonding point 32, the second bonding point 34, and the first kink 42 lie substantially on a first vertical plane 50. The first bonding point 32, the first kink 42, the span portion 46, and the second kink 44 lie substantially on a second vertical plane 52. The second kink 44, the slope portion 48, and the second bonding point 34 lie substantially within a third vertical plane 54. The first, second, and third vertical planes 50, 52, 54 intersect to form a triangular prism with a substantially uniform cross-sectional area. In another words, the second vertical plane 52 is disposed at an angle to the first vertical plane 50, and the third vertical plane 54 is disposed at an angle to both the first vertical plane 50 and the second vertical plane 52.

The second kink 44 may be horizontally spaced from the first vertical plane 50 by a distance that is between about 1% to about 20% of the length of the wire loop 40 from the first kink 42 to the second kink 44. Preferably, the second kink 44 is horizontally spaced from the first vertical plane by a distance that is between about 5% to about 10% of the length of the wire loop 40 from the first kink 42 to the second kink 44.

Figure 1A:
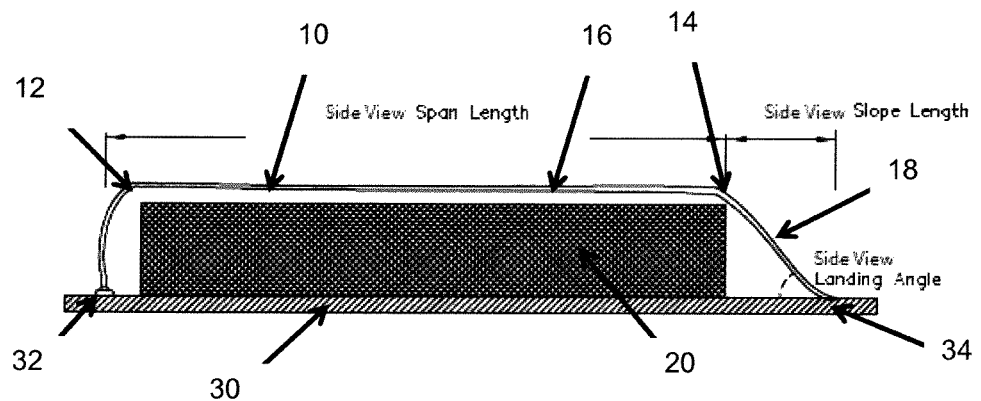
FIGS. 1A and 1B are side and top views respectively of a conventional wire loop employed in an over-die wire bonding application.
Figure 1B:
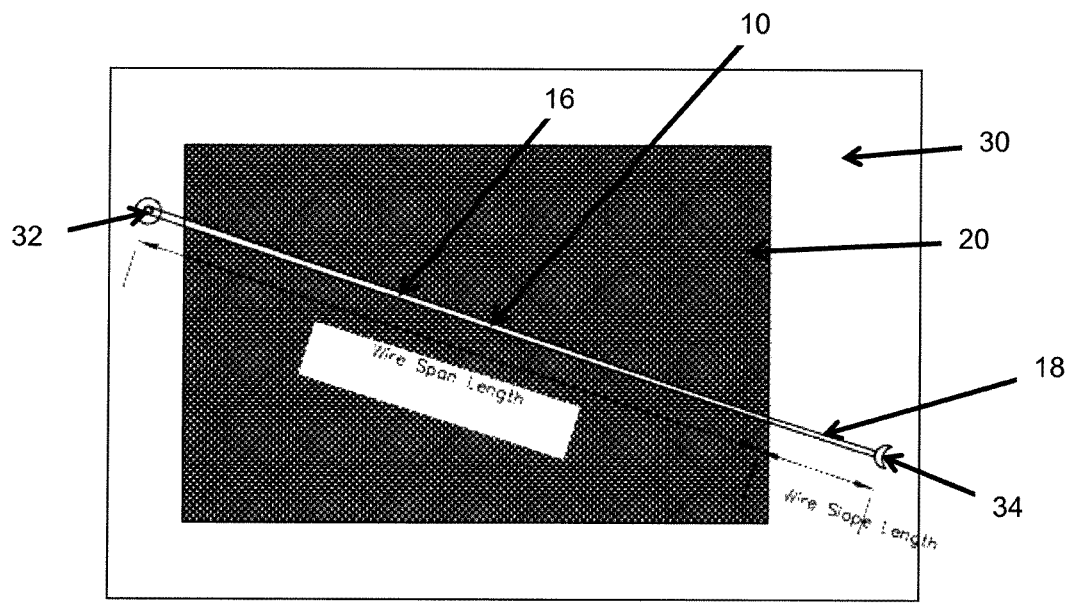

There are several advantages associated with spacing the second kink 44 of the wire loop 40 a distance from the first vertical plane 50. The slope portion 48 can now be longer without resulting in an increase to the side view total horizontal distance (as viewed from the side view shown in FIG. 2A). In fact, this also means that the second bonding point 34 can be moved closer to the side of the semiconductor die 20 during the design of the semiconductor package. Although the actual inclination of the slope portion 48 is now gentler (as compared to the conventional wire loop 10 shown in FIGS. 1A and 1B), the side view vertical landing angle of the wire loop 40 (as viewed from the side view shown in FIG. 2A) can now be larger as compared to conventional approaches. This effectively circumvents the limitation to the size of the side view vertical landing angle as faced by the conventional wire loop 10 shown in FIGS. 1A and 1B. Consequently, the side view horizontal span length of the wire loop 40 (as viewed from the side view shown in FIG. 2A) would also be higher as compared to that of the conventional wire loop 10 shown in FIGS. 1A and 1B. The preferred embodiment of the invention may allow the side view horizontal span length to be more than 90% of the side view total horizontal distance, and the side view vertical landing angle to be from about 80 degrees to about 90 degrees (as viewed from the side view shown in FIG. 2A). For example, the side view total horizontal distance is 2.0 mm, and the side view horizontal span length is 1.9 mm and the side view horizontal slope length is 1.0 mm. In this example, the side view horizontal span length percentage is 95% of the side view total horizontal distance.

In addition, the span portion 46 can now extend further outside the perimeter of the semiconductor die 20 without resulting in an increase to the side view total horizontal distance (as viewed from the side view shown in FIG. 2A). The advantage of this extension is that there will be a greater clearance at the second kink 44 between the wire loop 40 and the semiconductor die 20 surface to prevent contact between the wire loop 40 and the semiconductor die 20.

Figure 3A:
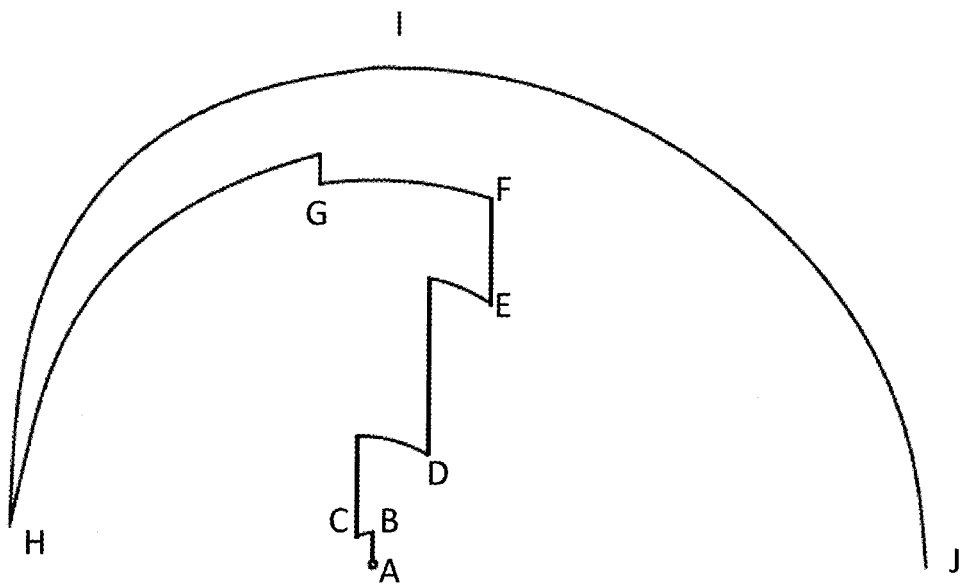
FIGS. 3A and 3B are side view and top view representations respectively of the preferred embodiment of a loop motion profile of a wire bonding device employing a wire bonding method according to the invention.
Figure 3B:
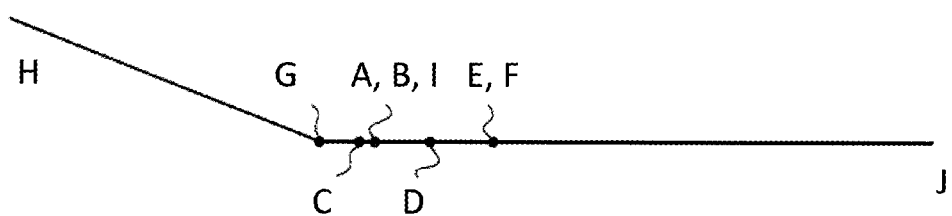

FIGS. 3A and 3B are side view and top view representations respectively of the preferred embodiment of a loop motion profile of a wire bonding device employing a wire bonding method according to the invention. FIGS. 4A to 4J are diagrammatic illustrations showing the shapes of a bonding wire 60 at different positions of a bonding tool, such as a capillary 62, during wire loop formation according to the preferred embodiment of the invention.

The capillary 62 feeds the bonding wire 60 to bond the bonding wire 60 between a first bonding surface 64 and a second bonding surface 66 to form a wire loop 40. A first bond 70 is first made at a first bonding point 32 (point A) on the first bonding surface 64. The capillary 62 is then moved away from the first bond 70 by a predetermined distance. This may be done by moving the capillary 62 substantially vertically upwards by a certain distance to point B, and to point C by a reverse action motion away from a second bonding point 34 (point J) on the second bonding surface 66. This latter motion bends the bonding wire 60 to form a first kink 42. As shown in FIG. 3B, point A, point B, point C, and point J lie on a first vertical plane 50. Point A and point B lie between point C and point J as seen from the top view shown in FIG. 3B.

From point C, the capillary 62 is moved in a forward action motion towards the second bonding point 34 (point J) and vertically upwards, to point D and then further on to point E. Thereafter, the capillary 62 is moved substantially vertically upwards again to point F, and then to point G by a reverse action motion as well as upwards. The motions of the capillary 62 from point C to point G release a length of bonding wire 60 to allow a sufficient length of bonding wire 60 be fed out to form a span portion 46 of the wire loop 40. As shown in FIG. 3B, point A (and point B), point C, point D, point E, point F, point G, and point J all lie on the first vertical plane 50.

The capillary 62 is moved from point G to point H in a diagonally downwards movement, and in a reverse and lateral action motion which is at an acute angle to the first vertical plane 50 away from the second bonding point 34 (point J). This combination of the diagonally downwards movement and reverse and lateral motion of the capillary 62 bends the bonding wire 60 to form a second kink 44, such that the span portion 46 of the wire loop 40 is disposed at an angle to the first vertical plane 50. As shown in FIG. 3B, point H lies outside the first vertical plane 50, and horizontally located further away from point J than point G.

From point H, the capillary 62 is moved upwards, and in a forward lateral action motion back towards the first vertical plane 50 and in the direction of the second bonding point 34 (point J). The vertical motion from point H ends at point I which is located substantially vertically above the first bonding point 32 (point A). The motion of the capillary 62 from point H to point I allows a sufficient length of bonding wire 60 be fed out to form a slope portion 48 of the wire loop 40. Thereafter, the capillary 62 is moved downwards and in a forward action motion to the second bonding point 34 (point J) in order to form a second bond 72. This completes the formation of the wire loop 40.

Figure 5:
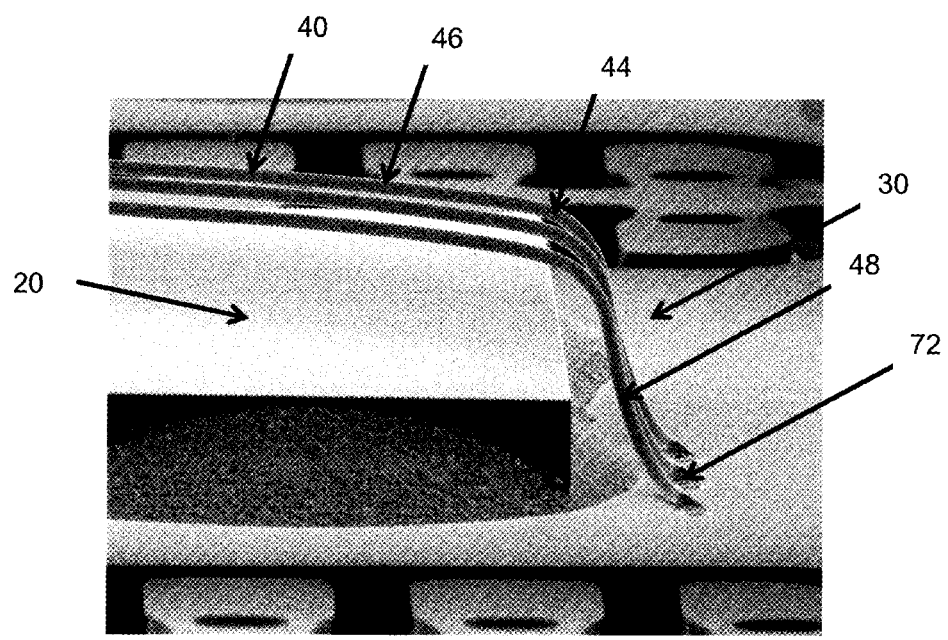
FIG. 5 illustrates a perspective photographic view of portions of the wire loops formed using the preferred embodiment of the invention.

FIG. 5 illustrates a perspective photographic view of portions of the wire loops 40 formed using the preferred embodiment of the invention. The span portions 46 extend to outside the perimeter of the semiconductor die 20, so that there are substantial clearances at the second kinks 44 between the wire loops 40 and the semiconductor die 20 surface to avoid contact between the wire loops 40 and the semiconductor die 20. Similarly, the second bonding points 34 can also be moved nearer to the side of the semiconductor die 20 during the design of the semiconductor package.

Although the present invention has been described in considerable detail with reference to certain embodiments of the invention, other embodiments are also possible.

For example, the invention is not limited to wire loops employed in over-die wire bonding applications. The invention may be employed in any other applications that require wire bonding, for example in-board wire bonding applications.

The invention described herein is susceptible to variations, modifications and/or additions other than those specifically described and it is to be understood that the invention includes all such variations, modifications and/or additions which fall within the spirit and scope of the above description.

The invention claimed is:

1. A method of bonding wire between first and second bonding points with a bonding tool, the method comprising:
    forming a first bond at the first bonding point with the bonding tool;
    forming a first kink located over the first bond;
    moving the bonding tool to a first position spaced from the first kink by a predetermined distance to release a length of wire from the bonding tool;
    moving the bonding tool in a direction away from the second bonding point to a second position which is outside an infinite plane comprising the first bonding point, the second bonding point, and the first kink;
    forming a second kink which lies outside the infinite plane; and
    moving the bonding tool to the second bonding point to form a second bond.

2. The method of bonding wire according to claim 1, wherein the step of forming the first kink located over the first bond further comprises the step of moving the bonding tool in a direction away from the second bonding point followed by moving the bonding tool in an opposite direction towards the second bonding point.

3. The method of bonding wire according to claim 2, wherein the step of moving the bonding tool to the second position further comprises the step of moving the bonding tool downwards to form the second kink, such that a portion of the wire between the first and second kinks is disposed at an angle to the infinite plane.

4. The method of bonding wire according to claim 3, wherein the second kink is horizontally spaced from the infinite plane by a distance of between 1% and 20% of a length of the portion of wire between the first and second kinks.

5. The method of bonding wire according to claim 4, wherein the second kink is horizontally spaced from the infinite plane by a distance of between 5% and 10% of the length of the portion of wire between the first and second kinks.

6. The method of bonding wire according to claim 1, wherein the step of moving the bonding tool to the first position spaced from the first kink by the predetermined distance comprises the step of moving the bonding tool upwards and in a direction towards the second bonding point.

7. The method of bonding wire according to claim 1, wherein a side view horizontal span length of a portion of a wire loop formed between the first and second kinks is more than 90% of a side view total horizontal distance between the first and second bonds.

8. The method of bonding wire according to claim 7, wherein the side view horizontal span length is 95% of the side view total horizontal distance between the first and second bonds.

9. The method of bonding wire according to claim 1, wherein a side view vertical landing angle between a slope portion of the wire., between the second kink and the second bond, and a surface on which the second bond is formed is between 80 degrees and 90 degrees.

10. A wire loop bonded between a first bonding point and a second bonding point, the wire loop comprising:
    a first kink located above the first bonding point, wherein the first and second bonding points and the first kink lie on a first infinite plane;
    a second kink located outside the first infinite plane; and
    a span portion connecting the first kink and the second kink, wherein the first and second kinks and the first bonding point lie on a second infinite plane which is disposed at an angle to the first infinite plane.

11. The wire loop according to claim 10, further comprising:
    a slope portion connecting the second kink and the second bonding point, wherein the second kink, the slope portion, and the second bonding point lie on a third infinite plane which is disposed at an angle to both the first infinite plane and the second infinite plane.

12. The wire loop according to claim 11, wherein a side view vertical landing angle between a slope portion of the wire loop, between the second kink and the second bond, and a surface on which the second bond is formed is between 80 degrees and 90 degrees.

13. The wire loop according to claim 10, wherein a side view horizontal span length of a portion of the wire loop formed between the first and second kinks is more than 90% of a side view total horizontal distance between the first and second bonding points.

14. The wire loop according to claim 10, wherein the second kink is horizontally spaced from the first infinite plane by a distance of between 1% and 20% of a length of the portion of wire between the first and second kinks.

15. The wire loop according to claim 14, wherein the second kink is horizontally spaced from the first infinite plane by a distance of between 5% and 10% of the length of the portion of wire between the first and second kinks.

* * * * *